(12) United States Patent
Goetz (10) Patent No.: US 7,826,280 B2
(45) Date of Patent: Nov. 2, 2010

(54) INTEGRATED CIRCUIT AND METHOD FOR READING THE CONTENT OF A MEMORY CELL

(75) Inventor: Marco Goetz, Radebeul (DE)

(73) Assignee: Qimonda AG, Munich (DE)

( * ) Notice: Subject to any disclaimer, the term of this patent is extended or adjusted under 35 U.S.C. 154(b) by 251 days.

(21) Appl. No.: 12/057,746

(22) Filed: Mar. 28, 2008

(65) Prior Publication Data

US 2009/0244992 A1 Oct. 1, 2009

(51) Int. Cl.
*G11C 7/22* (2006.01)

(52) U.S. Cl. ............................. 365/189.15; 365/189.09; 365/189.05; 365/205

(58) Field of Classification Search ............ 365/189.15, 365/185.09, 189.05, 205
See application file for complete search history.

(56) References Cited

U.S. PATENT DOCUMENTS 7,376,044 B2 * 5/2008 Cho ...................... 365/233.17

* cited by examiner

*Primary Examiner*—Huan Hoang (57) ABSTRACT

In an embodiment, an integrated circuit having a memory cell arrangement is provided. The memory cell arrangement may include at least one memory cell, a read circuit configured to read the memory cell, wherein the read circuit includes an output holding circuit configured to hold a memory cell content signal read from the memory cell, and an enable circuit configured to provide the memory cell content signal at an output of the read circuit only in case the memory cell fulfills a predefined criterion.

6 Claims, 8 Drawing Sheets

FIG 9B

INTEGRATED CIRCUIT AND METHOD FOR READING THE CONTENT OF A MEMORY CELL

TECHNICAL FIELD

Embodiments relate generally to integrated circuits and methods for reading the content of a memory cell.

BACKGROUND

When reading the content of a memory cell in a memory cell arrangement, with increasing speed of the read operation, so-called glitches may occur within the read path, e.g., glitches may occur on a data bus of the memory cell arrangement in case of a non valid data read operation. In a conventional memory cell arrangement, a valid bit may only gate the read data after the data read from a memory cell has been latched in a data latch using combinatorial circuit elements, in other words, logic gates implementing a correspondingly provided logic function. However, the combinatorial circuit elements may cause glitches due to signal races of the signals being transferred via the combinatorial circuit elements.

BRIEF DESCRIPTION OF THE DRAWINGS

In the drawings, like reference characters generally refer to the same parts throughout the different views. The drawings are not necessarily to scale, emphasis instead generally being placed upon illustrating the principles of embodiments of the invention. In the following description, various embodiments are described with reference to the following drawings, in which.

DETAILED DESCRIPTION OF ILLUSTRATIVE EMBODIMENTS

In the description, the terms "connection" and "coupling" are intended to include a direct as well as an indirect "connection" and "coupling", respectively.

Furthermore, a Low level signal may refer to a low level signal having e.g. a voltage level of 0 volts, alternatively less or more than 0 volts, in an example smaller than a High level signal, which may refer to a high level signal having, e.g., a voltage level of 3 volts, 2 volts, 1.7 volts, or 1.3 volts.

Figure 1:
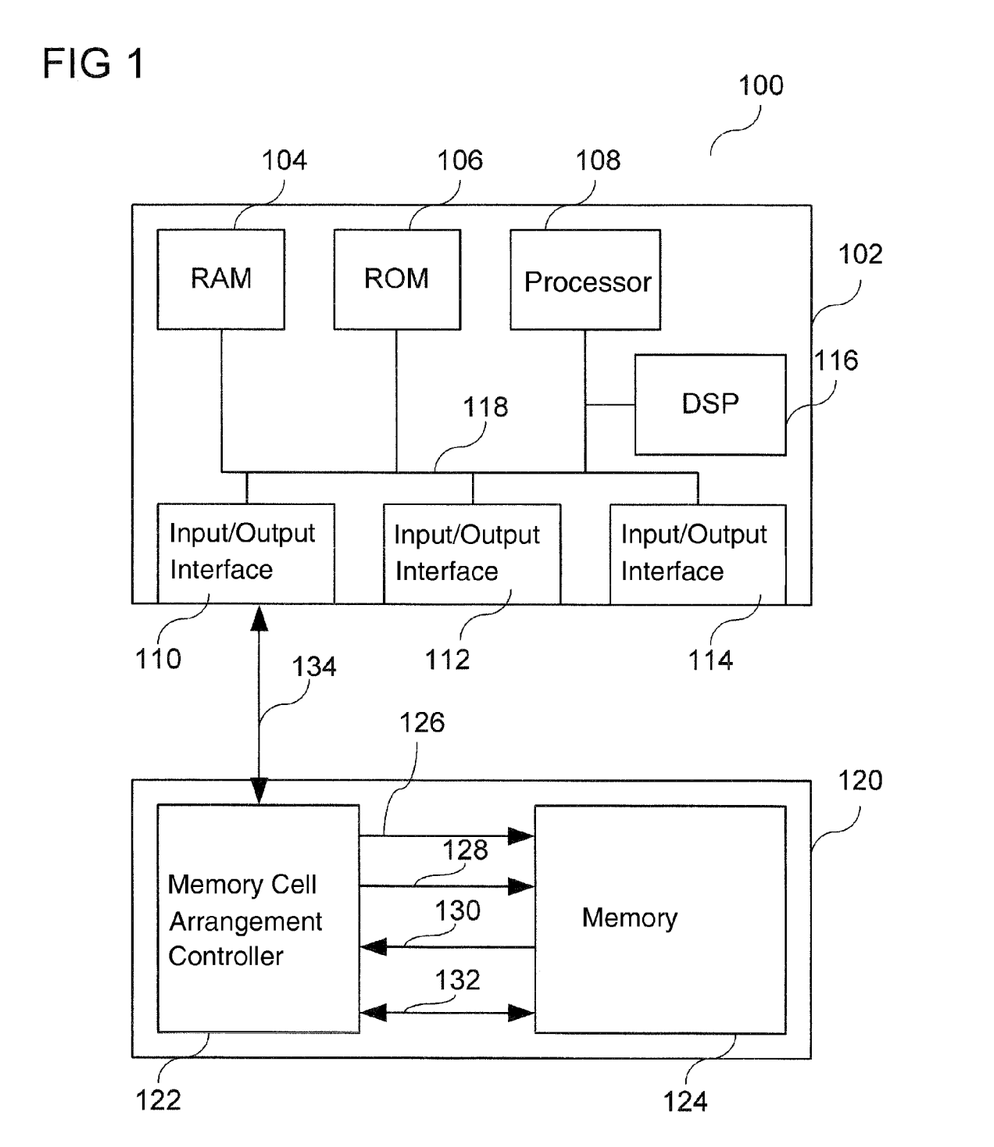
FIG. 1 shows a computer system having a memory cell arrangement in accordance with an embodiment.

FIG. 1 shows a computer system 100 having a computer arrangement 102 and a memory cell arrangement 120 in accordance with an embodiment.

In various embodiments, the computer arrangement 102 may be configured as or may include any device having a processor, e.g. having a programmable processor such as, e.g., a microprocessor (e.g., a CISC (complex instruction set computer) microprocessor or a RISC (reduced instruction set computer) microprocessor). In various embodiments, the computer arrangement 102 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), or another device having a processor (such as, e.g., a household appliance (such as, e.g., a washing machine, a dishwashing machine, etc.))

In an embodiment, the computer arrangement 102 may include one or a plurality of computer arrangement-internal random access memories (RAM) 104, e.g., one or a plurality of computer arrangement-internal dynamic random access memories (DRAM), in which, for example, data to be processed may be stored. Furthermore, the computer arrangement 102 may include one or a plurality of computer arrangement-internal read only memories (ROM) 106, in which, for example, the program code may be stored, which should be executed by a processor 108 (e.g., a processor as described above), which may also be provided in the computer arrangement 102.

Furthermore, in an embodiment, one or a plurality of input/output interfaces 110, 112, 114 (in FIG. 1, there are shown three input/output interfaces, in alternative embodiments, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment, each of the input/output interfaces 110, 112, 114 may be implemented in accordance with one of the following communication protocols:

an ad hoc communication protocol such as, e.g., Firewire or Bluetooth;

a communication protocol for a serial data transmission such as, e.g., RS-232, Universal Serial Bus (USB) (e.g., USB 1.0, USB 1.1, USB 2.0, USB 3.0);

any other communication protocol such as, e.g., Infrared Data Association (IrDA).

In an embodiment, the first input/output interface 110 is a USB interface (in alternative embodiments, the first input/output interface 110 may be configured in accordance with any other communication protocol such as, e.g., in accordance with a communication protocol which has been described above).

In an embodiment, the computer arrangement 102 optionally may include an additional digital signal processor (DSP) 116, which may be provided, e.g., for digital signal processing. Furthermore, the computer arrangement 102 may include additional communication modules (not shown) such as, e.g., one or a plurality of transmitters, one or a plurality of receivers, one or a plurality of antennas, and so on.

The computer arrangement 102 may also include additional components (not shown), which are desired or required in the respective application.

In an embodiment, some or all of the circuits or components provided in the computer arrangement 102 may be coupled with each other by means of one or a plurality of computer arrangement-internal connections 118 (for example, by means of one or a plurality of computer busses) configured to transmit data and/or control signals between the respectively coupled circuits or components.

Furthermore, as has been described above, the computer system 100, in accordance with an embodiment, may include the memory cell arrangement 120.

The memory cell arrangement 120 may in an embodiment be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment, the memory cell arrangement 120 is configured as a memory card.

In an embodiment, the memory cell arrangement 120 may include a memory cell arrangement controller 122 (for example, implemented by means of hard wired logic and/or by means of one or a plurality of programmable processors, e.g., by means of one or a plurality of programmable processors such as e.g. one or a plurality of programmable microprocessors (e.g., CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g., an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment, the memory cell arrangement controller 122 may be coupled to the first input/output interface 110 by means of a communication connection 134 (e.g., by means of a USB communication connection).

In an embodiment, the memory 124 may include one chip or a plurality of chips. Furthermore, the memory cell arrangement controller 122 may be implemented on the same chip (or die) as the components of the memory 124 or on a separate chip (or die).

Figure 2:
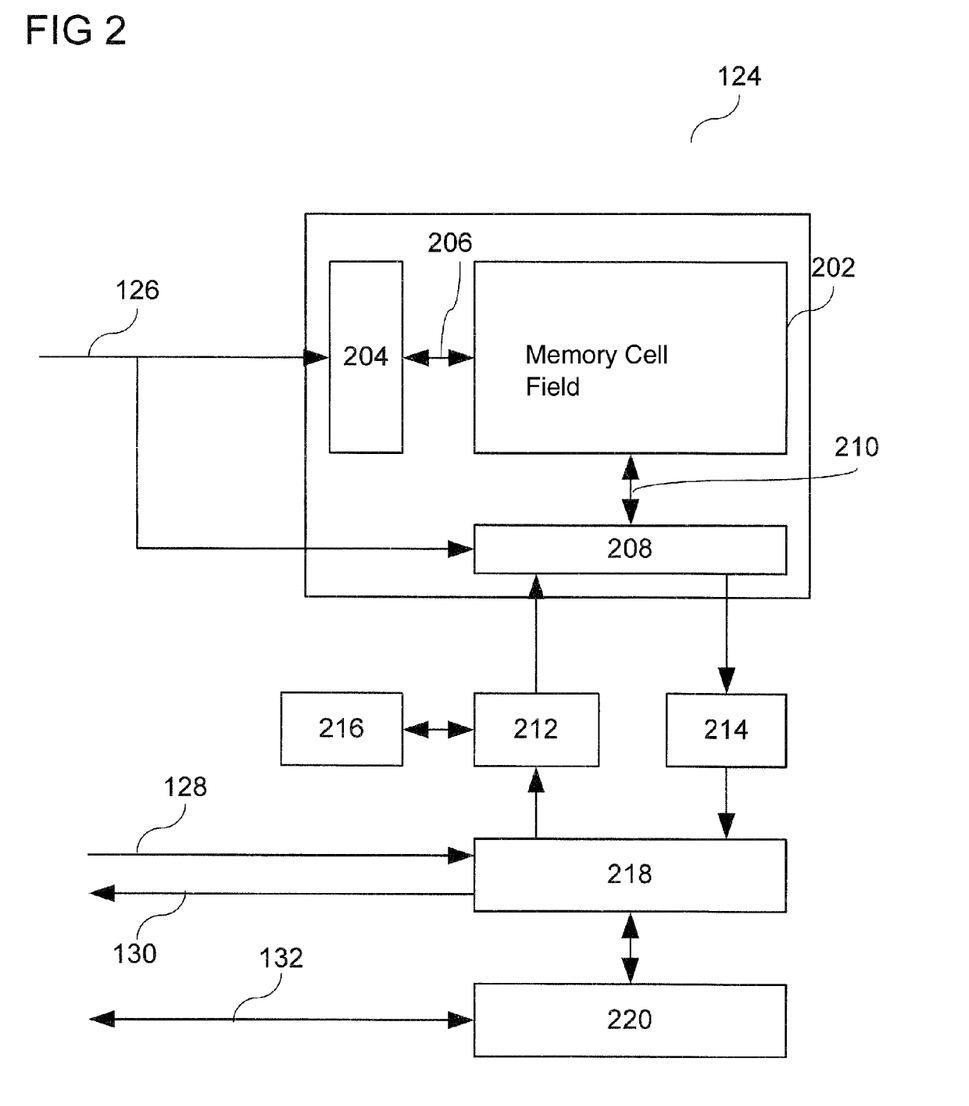
FIG. 2 shows a memory in accordance with an embodiment.

FIG. 2 shows the memory 124 of FIG. 1 in accordance with an embodiment in more detail.

In an embodiment, the memory 124 may include a memory cell field (e.g., a memory cell array) 202 having a plurality of memory cells. The memory cells may be arranged in the memory cell field 202 in the form of a matrix in rows and columns, or, alternatively, for example, in zig zag form. In other embodiments, the memory cells may be arranged within the memory cell field 202 in any other manner or architecture.

In general, each memory cell may, for example, be coupled with a first control line (e.g., a word line) and with at least one second control line (e.g., at least one bit line).

In an embodiment, in which the memory cells are arranged in the memory cell field 202 in the form of a matrix in rows and columns, a row decoder circuit 204 configured to select at least one row control line (e.g., a word line) of a plurality of row control lines 206 in the memory cell field 202 may be provided as well as a column decoder circuit 208 configured to select at least one column control line (e.g., a bit line) of a plurality of column control lines 210 in the memory cell field 202.

In an embodiment, the memory cells are non-volatile memory cells.

A "non-volatile memory cell" may be understood as a memory cell storing data even if it is not active. In an embodiment, a memory cell may be understood as being not active, e.g., if currently access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting, e.g., of:
  charge storing random access memory cells (e.g., floating gate memory cells or charge trapping memory cells);
  ferroelectric random access memory cells (FeRAM, FRAM);
  magnetoresistive random access memory cells (MRAM);
  phase change random access memory cells (PCRAM, for example, so called Ovonic Unified Memory (OUM) memory cells);
  conductive filament random access memory cells (e.g., conductive bridging random access memory cells (CBRAM), also referred to as programmable metallization cells (PMC), or carbon-based conductive filament random access memory cells);
  organic random access memory cells (ORAM);
  nanotube random access memory cells (NRAM) (e.g., carbon nanotube random access memory cells);

nanowire random access memory cells.

In alternative embodiments, also other types of non-volatile memory cells may be used.

In various embodiments, the memory cells may be resistive memory cells.

Furthermore, the memory cells may be electrically erasable read only memory cells (EEPROM).

In an embodiment, the memory cells may be Flash memory cells, e.g., charge storing memory cells such as, e.g., floating gate memory cells or charge trapping memory cells.

In an embodiment, each charge trapping memory cell includes a charge trapping layer structure for trapping electrical charge carriers. The charge trapping layer structure may include one or a plurality of two separate charge trapping regions. In an embodiment, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment, the charge trapping layer structure includes two, four or even more dielectric layers being formed above one another.

In an embodiment, the memory cells may be multi-bit memory cells. As used herein the term "multi-bit" memory cell is intended to, e.g., include memory cells which are configured to store a plurality of bits by spatially separated electric charge storage regions or current conductivity regions, thereby representing a plurality of logic states.

In another embodiment, the memory cells may be multi-level memory cells. As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In another embodiment, the memory cells may be volatile memory cells. In the context of this description, a "volatile memory cell" may be understood as a memory cell storing data, the data being refreshed during a power supply voltage of the memory system being active, in other words, in a state of the memory system, in which it is provided with a power supply voltage. In an embodiment, a "volatile memory cell" may be understood as a memory cell storing data, the data being refreshed during a refresh period in which the memory cell is provided with a power supply voltage corresponding to the level of the stored data. In an embodiment, the memory cells may be random access memory (RAM) memory cells, e.g., static random access memory (RAM) memory cells.

In an embodiment, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g., for one of the above described operations). The row decoder circuit 204 selects at least one row and thus at least one row control line 206 in accordance with the supplied address signal. Furthermore, the column decoder circuit 208 selects at least one column and thus at least one column control line 210 in accordance with the supplied address signal.

The electrical voltages that are provided in accordance with the selected operation, e.g., for reading, programming (e.g., writing) or erasing of one memory cell or of a plurality of memory cells, are applied to the selected at least one row control line 206 and to the at least one column control line 210.

In the case that each memory cell is configured in the form of a field effect transistor (e.g., in the case of a charge storing memory cell), in an embodiment, the respective gate terminal is coupled to the row control line 206 and a first source/drain terminal is coupled to a first column control line 210. A second source/drain terminal may be coupled to a second column control line 210. Alternatively, with a first source/drain terminal of an adjacent memory cell, which may then e.g. also be coupled to the same row control line 206 (this is the case, e.g., in a NAND arrangement of the memory cells in the memory cell field 202).

In an embodiment, by way of example, for reading or for programming, a single row control line 206 and a single column control line 210 are selected at the same time and are appropriately driven for reading or programming of the thus selected memory cell. In an alternative embodiment, it may be provided to respectively select a single row control line 206 and a plurality of column lines 210 at the same time for reading or for programming, thereby allowing to read or program a plurality of memory cells at the same time.

Furthermore, in an embodiment, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g., write) a memory cell, the data to be programmed may be received by a data register 218, which is coupled with the data write connection 128, by means of the data write connection 128, and may be buffered in the at least one write buffer memory 212 during the write operation.

In order to read a memory cell (in other words, to read the content stored in the memory cell), the data read from the addressed memory cell (represented, e.g., by means of an electrical current, which flows through the addressed memory cell and the corresponding column control line 210, which may be compared with a current threshold value in order to determine the content of the memory cell, wherein the current threshold value may e.g. be dependent from the reference memory cells 216) are, e.g., buffered in the read buffer memory 214 during the read operation. The result of the comparison and therewith the logic state of the memory cell (wherein the logic state of the memory cell represents the memory content of the memory cell) may then be stored in the data register 218 and may be provided via the data read connection 130 (e.g. implemented as a data bus), with which the data register 218 may be coupled.

The access operations (e.g., write operations, read operations, or erase operations) may be controlled by a memory-internal controller 220, which in turn may be controlled by the memory cell arrangement controller 122 by means of the bidirectional control/state connection 132. In an alternative embodiment, the data register 218 may directly be connected to the memory cell arrangement controller 122 by means of the bidirectional control/state connection 132 and thus directly controlled thereby. In this example, the memory-internal controller 220 may be omitted.

In an embodiment, the memory cells of the memory cell field may be grouped into memory blocks or memory sectors, which may be commonly erased in an erase operation. In an embodiment, there are many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits such as, e.g., charge pump circuits, etc.) may be provided in the memory 124, but they are neither shown in FIG. 1 nor FIG. 2 for reasons of clarity.

Figure 3:
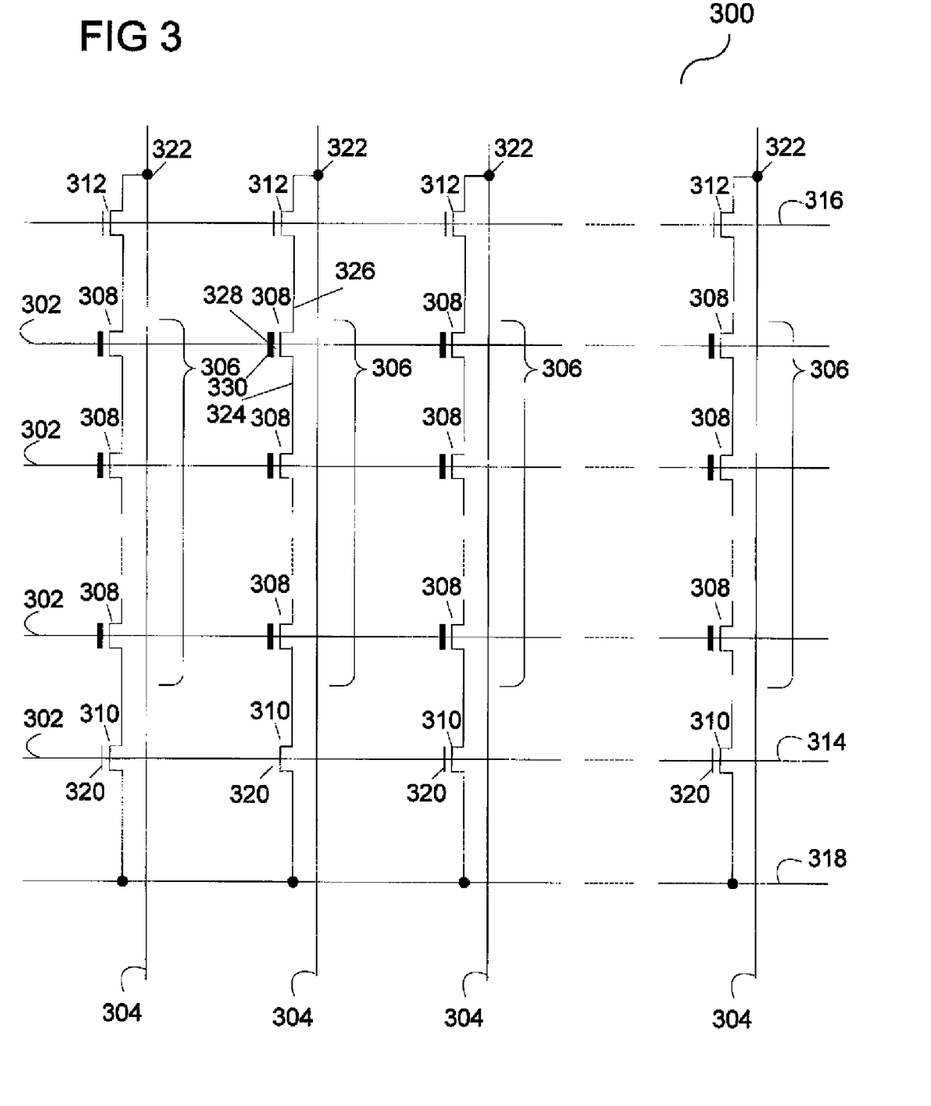
FIG. 3 shows an example of the memory cell field of FIG. 2 in accordance with an embodiment.

FIG. 3 shows a memory cell portion 300 of the memory cell field 202 in accordance with an embodiment.

In one embodiment, the memory cell portion 300 is arranged as a NAND memory cell field (although another coupling architecture may be provided in an alternative embodiment).

In an embodiment, the NAND memory cell portion 300 (e.g., a NAND memory cell array portion 300) may include word lines 302 (in general, an arbitrary number of word lines 302, in one embodiment, 1024 word lines 302) and intersecting bit lines 304 (in general, an arbitrary number of bit lines 304, in one embodiment, 512 bit lines 304).

The NAND memory cell array portion 300 may include NAND strings 306, each NAND string 306 having memory cells 308 (e.g., charge storing memory cells 308 such as e.g. charge trapping memory cells 308 or floating gate memory cells 308). Furthermore, an arbitrary number of memory cells 308 can be provided in the NAND string 306, in accordance with one embodiment, 32 memory cells 308. The memory cells 308 are connected in series source-to-drain between a source select gate 310, which may be implemented as a field effect transistor, and a drain select gate 312, which may also be implemented as a field effect transistor. Each source select gate 310 is positioned at an intersection of a bit line 304 and a source select line 314. Each drain select gate 312 is positioned at an intersection of a bit line 304 and a drain select line 316. The drain of each source select gate 310 is connected to the source terminal of the first charge trapping memory cells 308 of the corresponding NAND string 306. The source of each source select gate 310 is connected to a common source line 318. A control gate 320 of each source select gate 310 is connected to the source select line 314.

In one embodiment, the common source line 318 is connected between source select gates 310 for NAND strings 306 of two different NAND arrays. Thus, the two NAND arrays share the common source line 318.

In an embodiment, the drain of each drain select gate 312 may be connected to the bit line 304 of the corresponding NAND string 306 at a drain contact 322. The source of each drain select gate 312 is connected to the drain of the last charge storing memory cell 308 of the corresponding NAND string 306. In one embodiment, at least two NAND strings 306 share the same drain contact 322.

In accordance with the described embodiments, each memory cell 308 may include a source 324 (e.g., a first source/drain region), a drain 326 (e.g., a second source/drain region), a charge storage region 328 (e.g., a floating gate stack or a dielectric layer stack) and a control gate 330 (e.g., a gate region). The control gate 330 of each memory cell 308 may be connected to a respective word line 302. A column of the NAND memory cell array portion 300 may include a respective NAND string 306 and a row of the NAND memory cell array portion 300 may include those memory cells 308 that are commonly connected to a respective word line 302.

In an alternative embodiment, the memory cell portion 300 is a NOR memory cell array portion 300. In yet another embodiment, the memory cell portion 300 may be arranged in accordance with any other suitable architecture.

Figure 4:
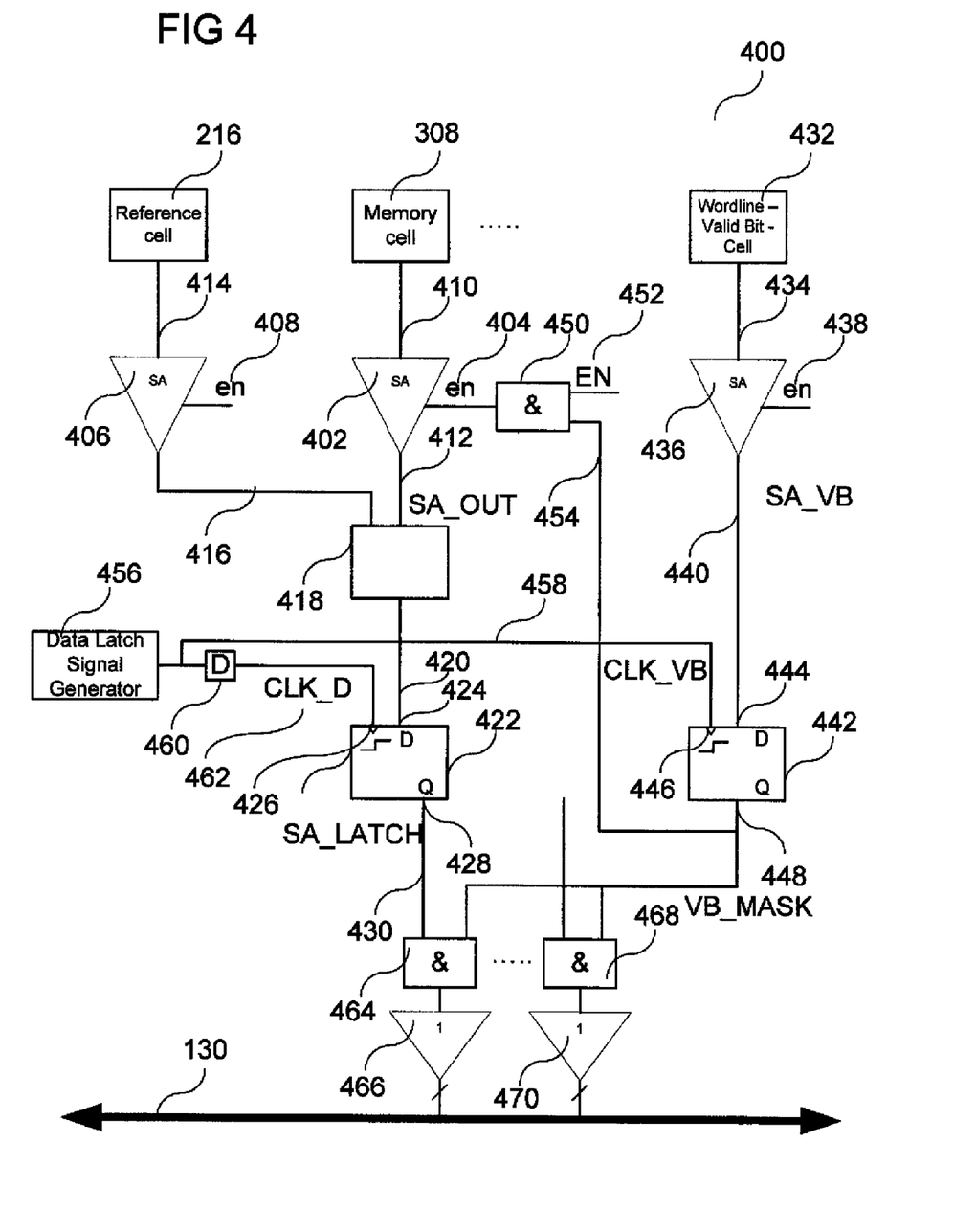
FIG. 4 shows an example of a portion of the memory of FIG. 2 in accordance with an embodiment.

FIG. 4 shows an example of a portion 400 of the memory 124 of FIG. 2 in accordance with an embodiment.

As shown in FIG. 4, in an example, the portion 400 of the memory 124 as shown includes, e.g., partially as part of the at least one read buffer memory 214, a memory cell sense amplifier circuit 402, a sense input of which is coupled with the memory cell 308 such that in a read operation, a memory cell content signal 410, which represents the status of the memory cell 308 and thus the content stored in the memory cell 308, is supplied to the sense input of the sense amplifier circuit 402. In an example, a plurality of sense amplifier circuits 402 may be provided. Furthermore, each memory cell sense amplifier circuit 402 may be coupled with one or more memory cells 308 so that a memory cell sense amplifier circuit 402 may be shared by a plurality of memory cells 308. Furthermore, each memory cell sense amplifier circuit 402 may include an enable input to receive a memory cell sense amplifier circuit enable signal 404 which enables or disables the memory cell sense amplifier circuit 402, depending on the state of the memory cell sense amplifier circuit enable signal 404, and an output. The generation of the memory cell sense amplifier circuit enable signal 404 will be described in more detail below. In an example, in case the memory cell sense amplifier circuit 402 is enabled, an amplified memory cell content signal SA_OUT 412 is provided at the output of the memory cell sense amplifier circuit 402. In case the memory cell sense amplifier circuit 402 is disabled, a Low level signal is provided at the output of the memory cell sense amplifier circuit 402, in other words, the memory cell content signal 410 is not amplified by the memory cell sense amplifier circuit 402. In other words, the memory cell content signal 410 may be blocked or suppressed by the memory cell sense amplifier circuit 402.

Furthermore, one or more reference cell sense amplifier circuits 406 may be included in the memory 124, wherein each reference cell sense amplifier circuit 406 may include a reference signal input coupled with the reference memory cell 216 to receive a reference memory cell signal 414 representing a reference signal value. Furthermore, each reference cell sense amplifier circuit 406 may be coupled with one or more reference memory cells 216 so that a reference cell sense amplifier circuit 406 may be shared by a plurality of reference memory cells 216. Furthermore, each reference cell sense amplifier circuit 406 may include an enable input to receive a reference cell sense amplifier circuit enable signal 408 which enables or disables the reference cell sense amplifier circuit 406, depending on the state of the reference cell sense amplifier circuit enable signal 408, and an output. In an example, in case the reference cell sense amplifier circuit 406 is enabled, an amplified reference memory cell signal 416 is provided at the output of the reference cell sense amplifier circuit 406. In case the reference cell sense amplifier circuit 406 is disabled, a Low level signal is provided at the output of the reference cell sense amplifier circuit 406, in other words, the reference memory cell signal 414 is not amplified by the reference cell sense amplifier circuit 406.

The output of the memory cell sense amplifier circuit 402 is coupled with a first input of a comparator 418, so that the amplified memory cell content signal SA_OUT 412 may be supplied to the first input of the comparator 418. The output of the reference cell sense amplifier circuit 406 is coupled with a second input of the comparator 418, so that the amplified reference memory cell signal 416 may be supplied to the second input of the comparator 418. The comparator 418 may compare the amplified reference memory cell signal 416 with the amplified memory cell content signal SA_OUT 412, thereby determining the state of the memory cell 308 with respect to the reference memory cell 216. The result of the comparison is provided at an output of the comparator 418 as a memory cell content result signal 420.

Furthermore, an output holding circuit 422 (which may be part of the data register 218) may be provided (in an alternative example, the data register 218 may be omitted and only the output holding circuit 422 may be provided together with the further components coupled with the output holding circuit 422, as will be described in more detail below), which may be implemented as a latch. In an example, a latch may be understood as a bistable multivibrator, i.e. a circuit which may have two states and thus can store one bit of information. In an example, the latch may be implemented as a D latch (alternatively as an SR latch), e.g., as an edge-triggered D latch (alternatively as an edge-triggered SR latch). In an example, the output holding circuit 422 may include a output holding circuit data input (e.g., a D input of a D latch) 424, an output holding circuit clock input 426 and an output holding circuit output (e.g., a Q output of a D latch) 428. In an example, the output holding circuit data input 424 is coupled with the output of the comparator 418. Thus, in this example, the memory cell content result signal 420 is supplied to the output holding circuit data input 424. The generation of the signal supplied to the output holding circuit clock input 426 will be described in more detail below. When activated by the signal supplied to the output holding circuit clock input 426, the memory cell content result signal 420 is taken over by the output holding circuit output 428 and provided there as a memory cell content result hold signal 430.

In an example, the memory 124 may further include a valid bit memory cell 432, which has stored an information as to whether the memory cell fulfills a predefined criterion. In an example, the predefined criterion may be that the memory cell is a valid bit memory cell (e.g., in the sense that a valid bit memory cell should provide its content to the data read connection 130 (e.g., a data bus)). In another example, the predefined criterion may be an information as to whether the memory cell stores one or more valid bits of information. In an example, the valid bit may be an information as to whether the content of the memory cell has already been stored in buffer memory cells of the memory cell arrangement, e.g., in static memory cells, or in other non-volatile memory cells, which serve as buffer memory cells for the memory cells 308 of the memory 124. In this example, the memory cells 308 of the memory 124 may be grouped in memory cell groups, e.g., in memory pages or memory blocks (e.g., in erase blocks, in other words in memory cell groups, which are respectively erased together), or in other types of memory cell groups. In an example, a memory page includes all memory cells, which are coupled with the same memory cell control line such as, e.g., with the same word line. In an example, the valid bit memory cell 432 may be provided for and assigned to a plurality of memory cells 308, e.g., to one or more memory cell groups. In this example, the valid bit may be an information as to whether the content of the assigned memory cells (e.g., the memory cells of an assigned memory page) is valid or not valid. In an example, the buffer memory may respectively store the content of at least one respective memory page. In an example, a first bit value (e.g., a bit value "0") of a valid bit signal 434, which represents the content of the valid bit memory cell 432, may represent the information that the content of the memory cell(s) 308 is invalid (e.g., because the content of the memory cell 308 is already transferred into a buffer memory (e.g., an SRAM of the memory cell arrangement) and therefore should not be provided at the data read connection 130 in order to save energy, as will be described in more detail below. A second bit value (e.g., a bit value "1") of the valid bit signal 434 may represent the information that the content of the memory cell(s) 308 is valid (e.g., because the content of the memory cell 308 has not yet been transferred into a buffer memory (e.g., an SRAM of the memory cell arrangement) and therefore should be provided at the data read connection 130.

In an alternative example, the memory cell described as the memory cell 308 may be a memory cell as part of the buffer memory, e.g., an SRAM memory cell, in which data stored in a non-volatile memory cell is buffered during a read operation.

Furthermore, one or more valid bit memory cell sense amplifier circuits 436 may be included in the memory 124, wherein each valid bit memory cell sense amplifier circuit 436 may include a valid bit signal input coupled with the valid bit memory cell 432 to receive the valid bit signal 434. Furthermore, each valid bit memory cell sense amplifier circuit 436 may be coupled with one or more valid bit memory cells 432 so that a valid bit memory cell sense amplifier circuit 436 may be shared by a plurality of valid bit memory cells 432. Furthermore, each valid bit memory cell sense amplifier circuit 436 may include an enable input to receive a valid bit memory cell sense amplifier circuit enable signal 438 which enables or disables the valid bit memory cell sense amplifier circuit 436, depending on the state of the valid bit memory cell sense amplifier circuit enable signal 438, and an output. In an example, in case the valid bit memory cell sense amplifier circuit 436 is enabled, an amplified valid bit signal SA_VB 440 is provided at the output of the valid bit memory cell sense amplifier circuit 436. In case the valid bit memory cell sense amplifier circuit 436 is disabled, a Low level signal is provided at the output of the valid bit memory cell sense amplifier circuit 436, in other words, the valid bit signal 434 is not amplified by the valid bit memory cell sense amplifier circuit 436.

Furthermore, a valid bit holding circuit 442 may be provided, which may be implemented as a latch. In an example, the latch may be implemented as a D latch (alternatively as an SR latch), e.g. as an edge-triggered D latch (alternatively as an edge-triggered SR latch). In an example, the valid bit holding circuit 442 may include a valid bit holding circuit data input (e.g., a D input of a D latch) 444, a valid bit holding circuit clock input 446 and a valid bit holding circuit output (e.g., a Q output of a D latch) 448. In an example, the valid bit holding circuit data output 448 is coupled with a first input of a first AND gate 450, a second input of which may be supplied with a first AND gate enable signal 452. In this example, the amplified valid bit signal 440 is supplied to the valid bit holding circuit data input 444. The generation of the signal supplied to the valid bit holding circuit clock input 446 will be described in more detail below. When activated by the signal supplied to the valid bit holding circuit clock input 446, the amplified valid bit signal 440 is taken over by the valid bit holding circuit output 448 and provided there as a valid bit hold signal 454 and may be supplied to the first input of the first AND gate 450, and, in case that the first AND gate enable signal 452 is a High level signal (e.g., logic "1"), may be gated to the enable input of the memory cell sense amplifier circuit 402 as the memory cell sense amplifier circuit enable signal 404, then enabling or activating the memory cell sense amplifier circuit 402. Illustratively, in case that the valid bit hold signal (also referred to as valid bit mask signal VB_MASK) 454 is a Low level signal representing the information that the content of the memory cell(s) 308 is invalid, the signal at the output of the first AND gate 450 also is a Low level signal and thus the enable input of the memory cell sense amplifier circuit 402 is supplied with a Low level signal, thereby disabling it.

Furthermore, a data latch signal generator circuit 456 is provided, which is configured to provide a clock signal, e.g., a clock signal which is provided to one or more of the clock inputs of holding circuits, e.g., the above mentioned holding circuits 422, 442. In an example, the data latch signal generator circuit 456 generates a valid bit holding circuit clock signal CLK_VB 458 and supplies it to the valid bit holding circuit clock input 446, thereby clocking the valid bit holding circuit 442.

In an example, a delay element 460 is connected into the signal path between the data latch signal generator circuit 456 and the output holding circuit clock input 426. In an example, using, e.g., the delay element 460, a signal to be supplied to the output holding circuit clock input 426 (also referred to as output holding circuit clock signal CLK_D 462) may be derived from the valid bit holding circuit clock signal CLK_VB 458. By way of example, the output holding circuit clock signal CLK_D 462 is delayed with respect to the valid bit holding circuit clock signal CLK_VB 458. In an alternative example, the valid bit holding circuit clock signal CLK_VB 458 and the output holding circuit clock signal CLK_D 462 may be generated independent from each other, but the output holding circuit clock signal CLK_D 462 is supplied to the output holding circuit 422 later than the valid bit holding circuit clock signal CLK_VB 458 is supplied to the valid bit holding circuit 442. The delay should be dimensioned in such a way that the memory cell content signal 410 can be suppressed or blocked (e.g., by disabling the memory cell sense amplifier circuit 402) before the output holding circuit 422 is activated (enabled) by the output holding circuit clock signal CLK_D 462.

When activated by the output holding circuit clock signal CLK_D 462 supplied to the output holding circuit clock input 424, the memory cell content result signal 420 is taken over to the valid bit holding circuit output 428 and provided there as a memory cell content result hold signal 430 and may be supplied to a first input of a second AND gate 464, a second input of which may be supplied with the valid bit hold signal 454. An output of the second AND gate 464 is coupled with a first inverter 466, which in turn is coupled with the data read connection 130 to supply the memory cell content result hold signal 430 to the data read connection 130 (e.g., the data bus).

It should be mentioned that in alternative embodiments, the blocking or suppressing of the memory cell content signal 410 may be provided at any other position in the signal path from the memory cell 308 and the data read connection 130 (e.g., a data bus).

A third AND gate 468 and a second inverter 470 symbolize that the above structure for a memory cell together with the assigned output holding circuit is provided a plurality of times (e.g., for the plurality of memory cells of a memory page), respectively.

Figure 5:
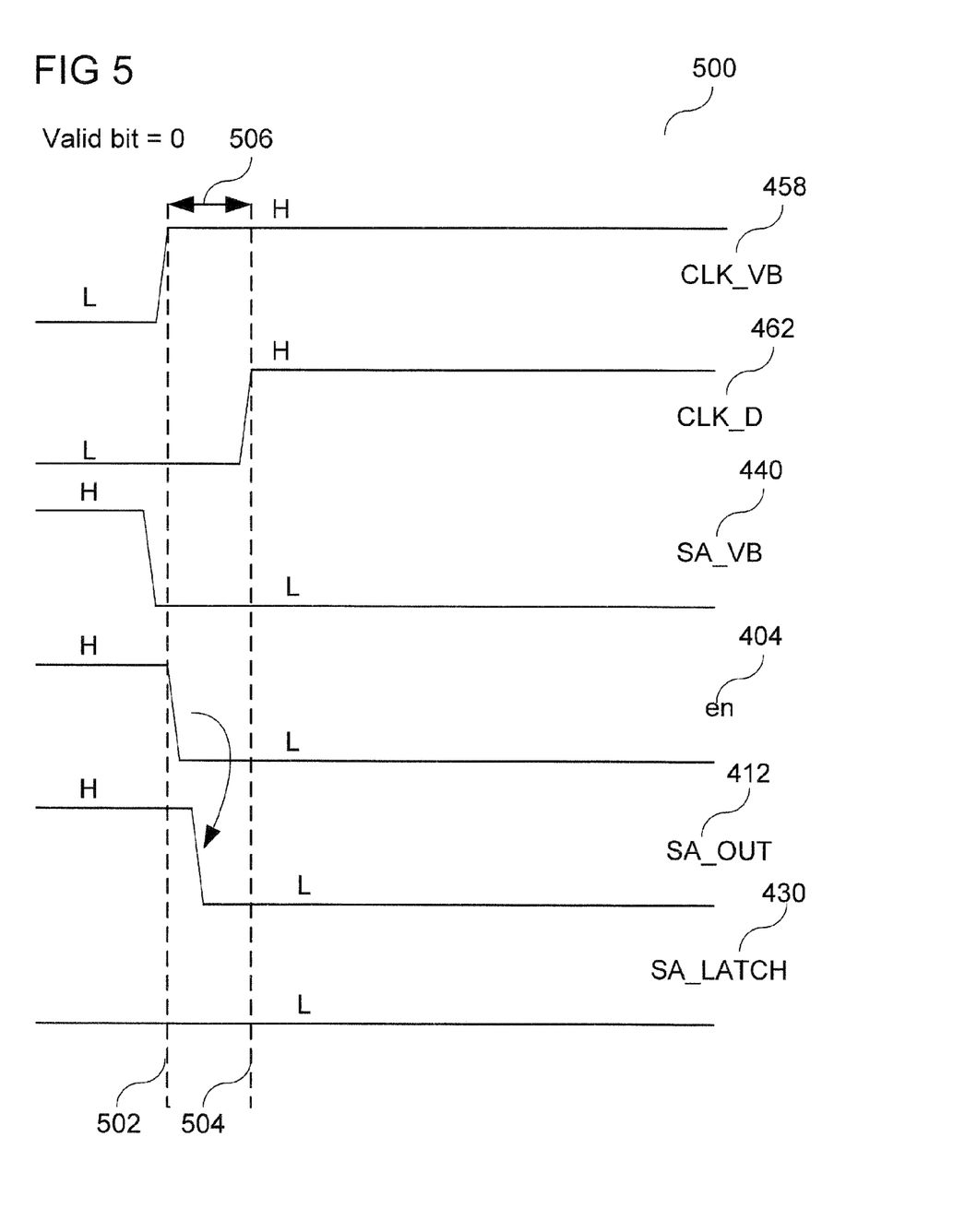
FIG. 5 shows various signals within the memory of FIG. 2 for the case where the valid bit signal is a Low level signal.

FIG. 5 shows various signals within the memory of FIG. 2 for the case that the valid bit signal 434 is a Low level signal (in this example of 0 V) (e.g., logic "0"), in a first time signal diagram 500.

In this example, it is assumed that the valid bit holding circuit clock signal CLK_VB 458 generated, e.g., by the data latch signal generator circuit 456 starts as a Low level signal level (L) (in this example of 0 V) and rises to a High level signal level (H) (in this example 1.7 V) at a first time instant 502 and then remains at the High level signal level (H).

Furthermore, it is assumed that the amplified valid bit signal SA_VB 440 starts as a High level signal level (H) (in this example 1.7 V) and goes down to a Low level signal level (L) (in this example of 0 V) before or at the first time instant 502 and then remains at the Low level signal level (L).

At the first time instant 502, the valid bit holding circuit 442 is activated by the valid bit holding circuit clock signal CLK_VB 458 and the signal (e.g., the amplified valid bit signal SA_VB 440) supplied to its data input 444 is transferred to the valid bit holding circuit output 448. Thus, the valid bit hold signal 454 goes down to a Low level signal level (L) (in this example of 0 V) at the first time instant 502 (the processing time within the valid bit holding circuit 442 is neglected). Further, it is assumed that the first AND gate enable signal 452 is a High level signal level (H) (in this example 1.7 V), thereby gating the first AND gate 450. Thus, also the memory cell sense amplifier circuit enable signal 404 (if it starts at a High level signal level (H) (in this example of 1.7 V) goes down to a Low level signal level (L) (in this example of 0 V) at the first time instant 502 (the processing time within the first AND gate 450 is neglected).

The falling edge of the memory cell sense amplifier circuit enable signal 404 causes a fall of the amplified memory cell content signal SA_OUT 412 from a High level signal level (H) (in this example of 1.7 V) to a Low level signal level (L) (in this example of 0 V).

The fall of the amplified memory cell content signal SA_OUT 412 leads to a signal course of the memory cell content result hold signal 430 such that when it starts at a Low level signal level (L) (in this example of 0 V), it remains at a Low level signal level (L) (in this example of 0 V) and is not risen, even if the memory cell content signal 410 was at a High level signal level (H), since this signal is not forwarded to the output holding circuit output 428. This is ensured, as shown in FIG. 5, by a delay of the output holding circuit clock signal CLK_D 462 compared with the valid bit holding circuit clock signal CLK_VB 458 by a delay time 506 (in other words, the output holding circuit clock signal CLK_D 462, also starting at a Low level signal level (L) (in this example of 0 V) remains at this level until a second time instant 504 (which may be determined as the first time instant 502 plus the delay time 506) and rises to a High level signal level (H) (in this example of 1.7 V) at the second time instant 504, well after the suppression or blocking of the memory cell content signal 410. In other words, the delay time 506 may be longer than the time needed to evaluate the valid bit signal 434 and, dependent on the result of the evaluation, to suppress or block (e.g., by disabling the memory cell sense amplifier circuit 402) the memory cell content signal 410, e.g., before it appears on the data read connection 130 (e.g., implemented as a data bus).

Illustratively, the valid bit is latched earlier than the memory data. The output of the valid bit latch 442 may gate the latched memory data and disables the sensing before the data latch (e.g., the output holding circuit 422) is enabled, thereby ensuring that in case the valid bit is zero (invalid data in the memory cell 308) the data latch (e.g., the output holding circuit 422) is updated with a Low level signal level (e.g., logic "0") at its output. This provides a glitch free signal on the data read connection 130 (e.g., implemented as a data bus) to save power.

Thus, in an example, in addition to possibly provided data mask combinatorics, the output of the data latch is updated to a Low level signal level (e.g. logic "0").

Figure 6:
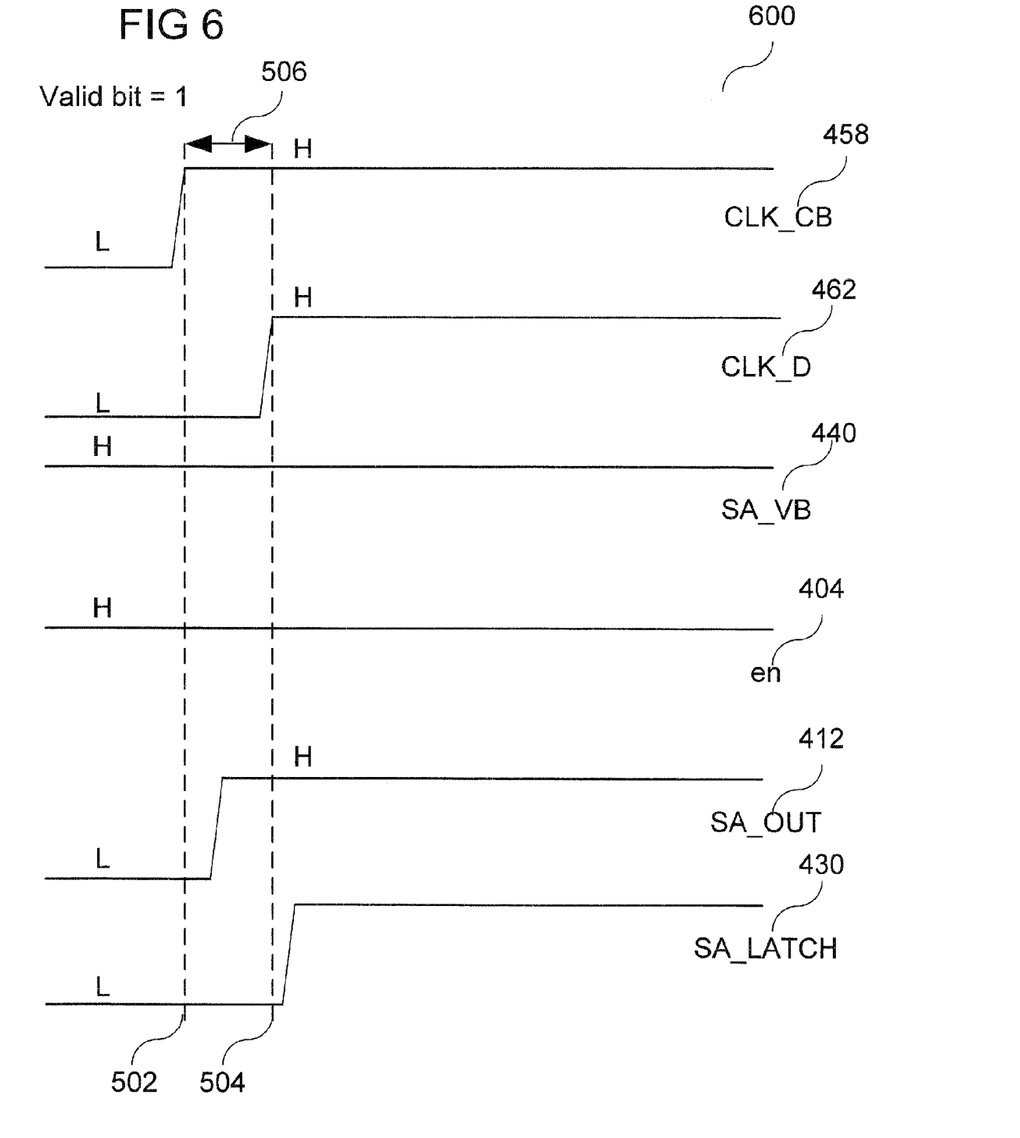
FIG. 6 shows various signals within the memory of FIG. 2 for the case where the valid bit signal is a High level signal.

FIG. 6 shows various signals within the memory of FIG. 2 for the case that the valid bit signal 434 is a High level signal (in this example of 1.7 V) (e.g. logic "1"), in a second time signal diagram 600.

In this example, it is assumed that the valid bit holding circuit clock signal CLK_VB 458 generated, e.g., by the data latch signal generator circuit 456 starts as a Low level signal level (L) (in this example of 0 V) and rises to a High level signal level (H) (in this example 1.7 V) at a first time instant 502 and then remains at the High level signal level (H).

Furthermore, it is assumed that the amplified valid bit signal SA_VB 440 starts and remains as a High level signal level (H) (in this example 1.7 V) since it is assumed that the valid bit signal is a High level signal level.

At the first time instant 502, the valid bit holding circuit 442 is activated by the valid bit holding circuit clock signal CLK_VB 458 and the signal (e.g., the amplified valid bit signal SA_VB 440) supplied to its data input 444 is transferred to the valid bit holding circuit output 448. Thus, the valid bit hold signal 454 starts and remains as a High level signal level (H) (in this example 1.7 V) even after the first time instant 502. Further, it is assumed that the first AND gate enable signal 452 is a High level signal level (H) (in this example 1.7 V), thereby gating the first AND gate 450. Thus, also the memory cell sense amplifier circuit enable signal 404 starts and remains at a High level signal level (H) (in this example of 1.7 V).

Since the memory cell sense amplifier circuit enable signal 404 starts and remains at a High level signal level (H) (in this example of 1.7 V), the amplified memory cell content signal SA_OUT 412 rises to a High level signal level (H) (in this example of 1.7 V) (in case that it starts at a Low level signal level (L) (in this example of 0 V) after the first time instant 502 and before the second time instant 504.

The rise of the amplified memory cell content signal SA_OUT 412 leads to a signal course of the memory cell content result hold signal 430 such that when it starts at a Low level signal level (L) (in this example of 0 V), it rises to a High level signal level (H) (in this example of 1.7 V), if the memory cell content signal 410 was at a High level signal level (H), since this signal is forwarded to the output holding circuit output 428.

Figure 7:
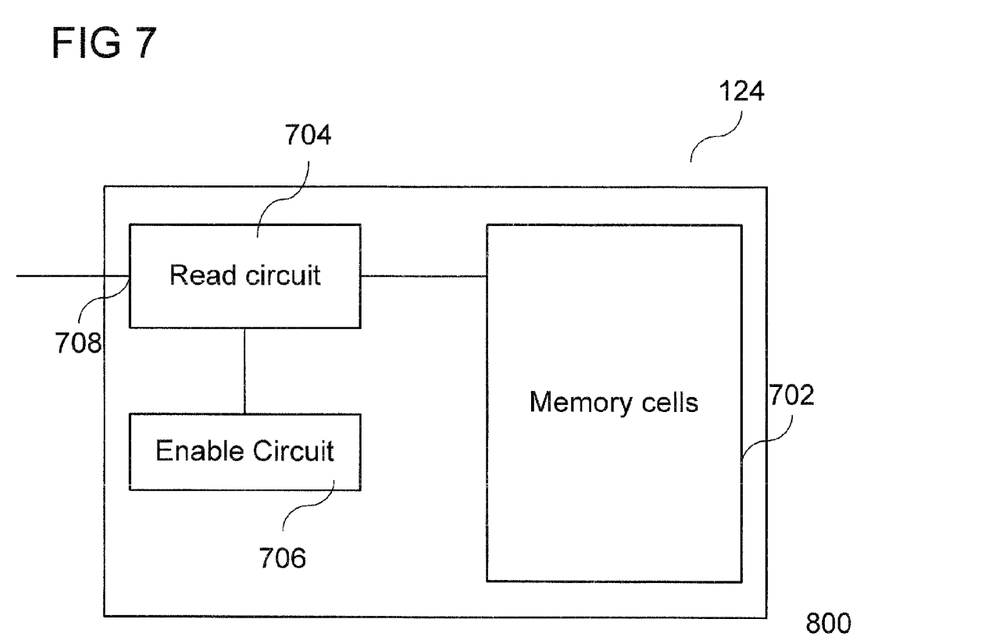
FIG. 7 shows a memory in accordance with another embodiment.

FIG. 7 shows a memory 124 as an example of a memory cell arrangement in accordance with another embodiment.

The memory 124 may include at least one memory cell (one or a plurality of memory cells) 702, a read circuit 704 configured to read the memory cell, wherein the read circuit may include an output holding circuit configured to hold a memory cell content signal read from the memory cell 702, and an enable circuit 706 configured to provide the memory cell content signal at an output 708 of the read circuit 704 only in case the memory cell 702 fulfills a predefined criterion.

The enable circuit 706 may be configured to provide the memory cell content signal at an output of the output holding circuit only in case the memory cell fulfills the predefined criterion.

The read circuit 704 may include a memory cell sense amplifier circuit, wherein an input of the memory cell sense amplifier circuit is coupled with the memory cell 702 to receive the memory cell content signal, wherein an enable input of the memory cell sense amplifier circuit is configured to receive a memory cell sense amplifier circuit enable signal, and wherein an output of the memory cell sense amplifier circuit is coupled with a data input of the output holding circuit.

The output holding circuit may be or may include a latch circuit.

The memory 124 may further include a data bus structure coupled with an output of the read circuit.

Further, the enable circuit 706 may further include an output holding circuit clock signal generator circuit configured to provide an output holding circuit clock signal.

The memory 124 may further include a valid bit memory cell storing an information as to whether the memory cell 702 is a valid bit memory cell. The valid bit memory cell may be coupled with a plurality of memory cells. By way of example, the valid bit memory cell may be coupled with a plurality of memory cells, which are all coupled with the same control line, e.g., with the same word line.

The memory 124 may further include a valid bit memory cell sense amplifier circuit, wherein an input of the valid bit memory cell sense amplifier circuit is coupled with the valid bit memory cell to receive a valid bit memory cell content signal, wherein an enable input of the valid bit memory cell sense amplifier circuit is configured to receive a valid bit memory cell sense amplifier circuit enable signal, and wherein an output of the valid bit memory cell sense amplifier circuit is coupled with the enable input of the memory cell sense amplifier circuit.

In an example, the memory 124 may include a valid bit memory cell signal holding circuit, wherein a data input of the valid bit memory cell signal holding circuit is coupled with the output of the valid bit memory cell sense amplifier circuit, and wherein an output of the valid bit memory cell signal holding circuit is coupled with the enable input of the memory cell sense amplifier circuit.

In an example, a clock input of the valid bit memory cell signal holding circuit is configured to receive a memory cell holding circuit clock signal.

In an example, the memory 124 may further include an output holding circuit clock signal generator circuit being coupled with the clock input of the valid bit memory cell signal holding circuit to provide the memory cell holding circuit clock signal.

The enable circuit 706 may further include a delay circuit configured to delay the output holding circuit clock signal with respect to the memory cell holding circuit clock signal.

The predefined criterion may be that the memory cell is a valid bit memory cell.

Figure 8:
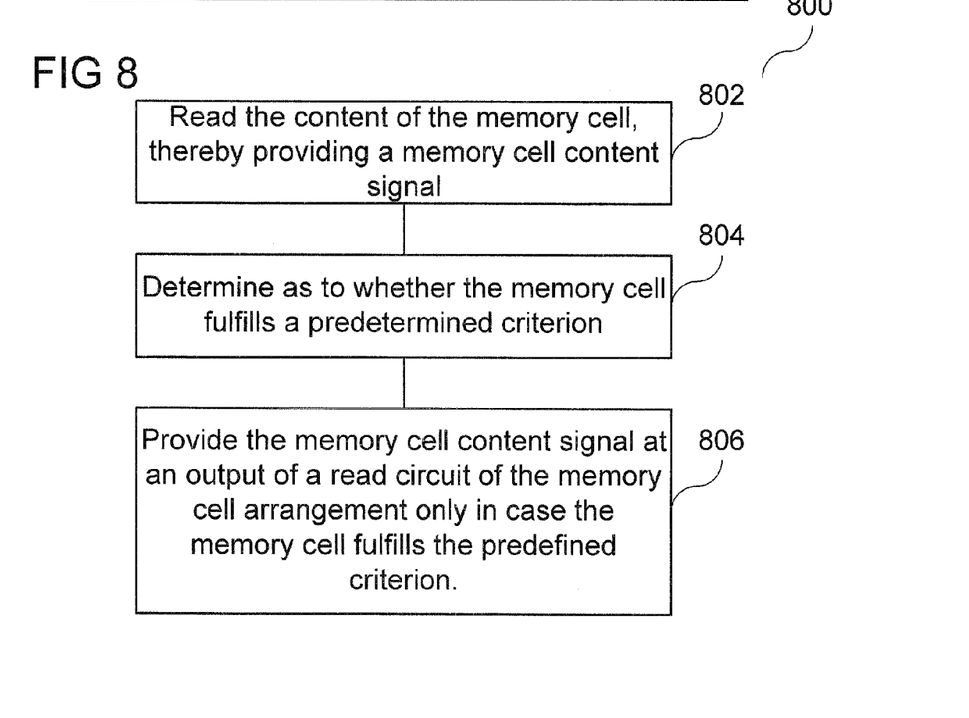
FIG. 8 shows a method for reading the content of a memory cell of a memory cell arrangement in an integrated circuit in accordance with another embodiment.

FIG. 8 shows a method 800 for reading the content of a memory cell of a memory cell arrangement in an integrated circuit in accordance with another embodiment.

In 802, the content of the memory cell may be read, thereby providing a memory cell content signal. Then, in 804, it is determined as to whether the memory cell fulfills a predetermined criterion. In 806, the memory cell content signal is provided at an output of a read circuit of the memory cell arrangement only in case the memory cell fulfills the predefined criterion.

The determining as to whether the memory cell fulfills a predetermined criterion may include determining as to whether the memory cell is a valid bit memory cell.

The read circuit may include a memory cell sense amplifier circuit. The memory cell content signal may be supplied to an input of the memory cell sense amplifier circuit, a memory cell sense amplifier circuit enable signal may be supplied to an enable input of the memory cell sense amplifier circuit, and an output signal of the memory cell sense amplifier circuit may be supplied to the output holding circuit.

The output holding circuit may be or may include a latch circuit.

An output holding circuit clock signal may be supplied to the output holding circuit.

The method may further include reading from a valid bit memory cell an information as to whether the memory cell is a valid bit memory cell.

Furthermore, the valid bit memory cell may be coupled with a plurality of memory cells. In an example, the valid bit memory cell may be coupled with a plurality of memory cells, which are all coupled with the same control line. In an example, the read information as to whether the memory cell may be a valid bit memory cell is supplied to a valid bit memory cell sense amplifier circuit, wherein an output signal of the valid bit memory cell sense amplifier circuit is supplied to the enable input of the memory cell sense amplifier circuit.

In another example, an output signal of the valid bit memory cell sense amplifier circuit may be supplied to a valid bit memory cell signal holding circuit, and an output signal of the valid bit memory cell signal holding circuit may be supplied to the enable input of the memory cell sense amplifier circuit.

A memory cell holding circuit clock signal may be supplied to the clock input of the valid bit memory cell signal holding circuit. Furthermore, the output holding circuit clock signal may be delayed with respect to the memory cell holding circuit clock signal.

The predefined criterion may be that the memory cell is a valid bit memory cell.

In another embodiment, an integrated circuit having a memory cell arrangement is provided. The memory cell arrangement may include at least one memory cell, a read circuit configured to read the memory cell, wherein the read circuit includes a holding circuit configured to hold a signal read from the memory cell, a data bus coupled with an output of the read circuit, and a circuit configured to provide the memory cell content signal at an output of the read circuit only in case the memory cell is a valid bit memory cell.

In another embodiment, a method for reading the content of a memory cell of a memory cell arrangement in an integrated circuit is provided. The method may include reading the content of the memory cell, thereby providing a memory cell content signal, determining as to whether the memory cell fulfills a predetermined criterion before the memory cell content signal is provided to a data bus of the memory cell arrangement, and blocking the memory cell content signal before it reaches an output of a read circuit of the memory cell arrangement in case the memory cell does not fulfill the predefined criterion.

Figure 9A:
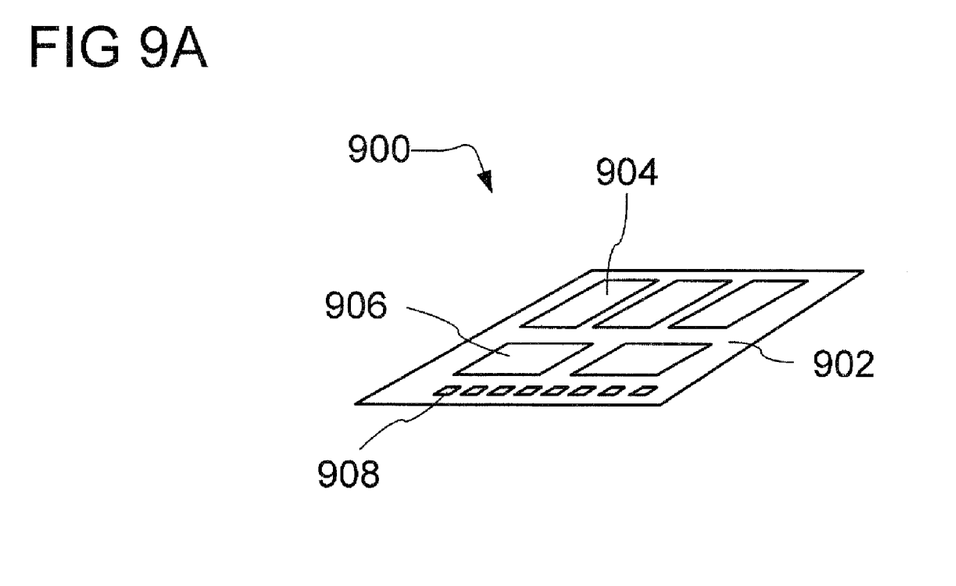
FIGS. 9A and 9B show a memory module (FIG. 9A) and a stackable memory module (FIG. 9B) in accordance with an embodiment.
Figure 9B:
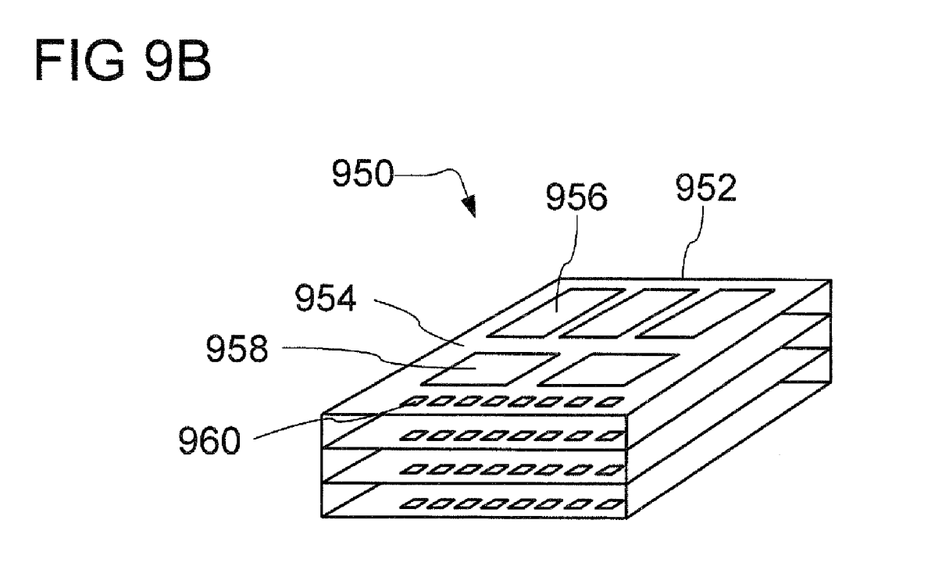

As shown in FIGS. 9A and 9B, in some embodiments, memory devices such as those described herein may be used in modules.

In FIG. 9A, a memory module 900 is shown, on which one or more memory devices 904 are arranged on a substrate 902. The memory device 904 may include numerous memory cells, each of which uses a memory element in accordance with an embodiment. The memory module 900 may also include one or more electronic devices 906, which may include memory, processing circuitry, control circuitry, addressing circuitry, bus interconnection circuitry, or other circuitry or electronic devices that may be combined on a module with a memory device, such as the memory device 904. Additionally, the memory module 900 includes multiple electrical connections 908, which may be used to connect the memory module 900 to other electronic components, including other modules.

As shown in FIG. 9B, in some embodiments, these modules may be stackable, to form a stack 950. For example, a stackable memory module 952 may contain one or more memory devices 956, arranged on a stackable substrate 954. The memory device 956 contains memory cells that employ memory elements in accordance with an embodiment. The stackable memory module 952 may also include one or more electronic devices 958, which may include memory, processing circuitry, control circuitry, addressing circuitry, bus interconnection circuitry, or other circuitry or electronic devices that may be combined on a module with a memory device, such as the memory device 956. Electrical connections 960 are used to connect the stackable memory module 952 with other modules in the stack 950, or with other electronic devices. Other modules in the stack 950 may include additional stackable memory modules, similar to the stackable memory module 952 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
at least one memory cell;
a read circuit configured to read the memory cell, wherein the read circuit comprises an output holding circuit configured to hold a memory cell content signal read from the memory cell;
an enable circuit configured to provide the memory cell content signal at an output of the read circuit only when the memory cell fulfills a predefined criterion,
wherein the enable circuit further comprises an output holding circuit clock signal generator circuit configured to provide an output holding circuit clock signal;
a valid bit memory cell storing information as to whether the memory cell is a valid bit memory cell;
a valid bit memory cell sense amplifier circuit;
wherein an input of the valid bit memory cell sense amplifier circuit is coupled with the valid bit memory cell to receive a valid bit memory cell content signal;
wherein an enable input of the valid bit memory cell sense amplifier circuit is configured to receive a valid bit memory cell sense amplifier circuit enable signal;
wherein an output of the valid bit memory cell sense amplifier circuit is coupled with the enable input of a memory cell sense amplifier circuit of the read circuit.

2. The integrated circuit of claim 1, further comprising:
a valid bit memory cell signal holding circuit;
wherein a data input of the valid bit memory cell signal holding circuit is coupled with the output of the valid bit memory cell sense amplifier circuit;
wherein an output of the valid bit memory cell signal holding circuit is coupled with the enable input of the memory cell sense amplifier circuit.

3. The integrated circuit of claim 2, wherein a clock input of the valid bit memory cell signal holding circuit is configured to receive a memory cell holding circuit clock signal.

4. The integrated circuit of claim 3, further comprising:
an output holding circuit clock signal generator circuit coupled with the clock input of the valid bit memory cell signal holding circuit to provide the memory cell holding circuit clock signal.

5. The integrated circuit of claim 4, wherein the enable circuit further comprises a delay circuit configured to delay the output holding circuit clock signal compared with the memory cell holding circuit clock signal.

6. A method for reading a memory cell, the method comprising:
reading the memory cell, thereby providing a memory cell content signal;
determining whether the memo cell fulfills a predetermined criterion; and
providing the memory cell content signal at an output of a read circuit of the memory cell arrangement only if the memory cell fulfills the predefined criterion,
wherein providing the memory cell content signal at the output of the read circuit comprises providing the memory cell content signal at an output of an output holding circuit configured to hold a memory cell content signal read from the memory cell of the memory cell arrangement only in case the memory cell fulfills the predefined criterion,
wherein the read circuit comprises a memory cell sense amplifier circuit;
wherein the memory cell content signal is supplied to an input of the memory cell sense amplifier circuit;
wherein a memory cell sense amplifier circuit enable signal is supplied to an enable input of the memory cell sense amplifier circuit; and
wherein an output signal of the memory cell sense amplifier circuit is supplied to the output holding circuit,
wherein the determining whether the memory cell fulfills a predetermined criterion comprises determining whether the memory cell is a valid bit memory cell;
wherein the read information as to whether the memory cell is a valid bit memory cell is supplied to a valid bit memory cell sense amplifier circuit;
wherein an output signal of the valid bit memory cell sense amplifier circuit is supplied to a valid bit memory cell signal holding circuit;
wherein an output signal of the valid bit memory cell signal holding circuit is supplied to the enable input of the memory cell sense amplifier circuit;
wherein a memory cell holding circuit clock signal is supplied to the clock input of the valid bit memory cell signal holding circuit; and
wherein the output holding circuit clock signal is delayed compared with the memory cell holding circuit clock signal.

* * * * *